(12) United States Patent
Daghighi

(10) Patent No.: US 9,077,588 B2
(45) Date of Patent: Jul. 7, 2015

(54) DOUBLE INSULATING SILICON ON DIAMOND DEVICE

(76) Inventor: Arash Daghighi, Isfahan (IR)

(*) Notice: Subject to any disclaimer, the term of this patent is extended or adjusted under 35 U.S.C. 154(b) by 680 days.

(21) Appl. No.: 12/848,150

(22) Filed: Jul. 31, 2010

(65) Prior Publication Data
US 2010/0295128 A1    Nov. 25, 2010

(51) Int. Cl.
*H01L 29/786* (2006.01)
*H04L 29/12* (2006.01)

(52) U.S. Cl.
CPC ...................................... *H04L 29/12* (2013.01)

(58) Field of Classification Search
CPC .................................................. H01L 29/1602
USPC ............. 257/347, 77, 625, E29.273, E23.111
See application file for complete search history.

(56) References Cited

U.S. PATENT DOCUMENTS

| | | | |
|---|---|---|---|
| 6,100,199 A * | 8/2000 | Joshi et al. | 438/694 |
| 6,573,565 B2 * | 6/2003 | Clevenger et al. | 257/355 |
| 6,909,146 B1 * | 6/2005 | Linn et al. | 257/347 |
| 7,271,447 B2 * | 9/2007 | Takizawa et al. | 257/349 |
| 2011/0156057 A1 * | 6/2011 | Mazellier et al. | 257/77 |

FOREIGN PATENT DOCUMENTS

WO    WO 2010012739 A1 *    2/2010    ............. H01L 21/20

* cited by examiner

*Primary Examiner* — Tom Thomas
*Assistant Examiner* — Benjamin Tzu-Hung Liu
(74) *Attorney, Agent, or Firm* — Van Dyke Law; Raymond Van Dyke

(57) ABSTRACT

A silicon-on-diamond (SOD) transistor includes a silicon-based substrate, a diamond insulating layer over the silicon-based substrate, a silicon-based insulating layer directly over and in contact with the diamond insulating layer, a body over the silicon-based insulating layer, and a gate over the body. The structure of the SOD transistor provides improved drain induced barrier lowering (DIBL) in fully-depleted SOD transistors by using a second, silicon-based insulating layer.

17 Claims, 5 Drawing Sheets

DOUBLE INSULATING SILICON ON DIAMOND DEVICE

SPONSORSHIP STATEMENT

This application has been sponsored by the Iranian Nanotechnology Initiative Council, and the Shahrekord University, which do not have any rights in this application.

TECHNICAL FIELD

This application generally relates to electrical devices, such as transistors, and more particularly relates to silicon-on-diamond transistors including multiple insulating layers.

BACKGROUND

Bulk metal-oxide-semiconductor-field-effect-transistors (hereinafter "MOSFETs") are typically fabricated in the top few micrometers of a silicon wafer having a total thickness of several hundred micrometers. As such, a majority of the parasitic effects in bulk MOSFETs are a result of the interaction between the fabricated transistors and the substrate.

Silicon-on-insulator (hereinafter "SOI") MOSFETs typically include a silicon layer that is overlaid on an insulation layer made of, for example, silicon dioxide, that is overlaid on a silicon substrate. The insulation layer of silicon dioxide can be created by introducing oxygen onto a silicon wafer and then heating the wafer to oxidize the silicon, thereby creating a uniform buried layer of silicon dioxide. In SOI MOSFETs, the dielectric isolation of the devices due to the silicon dioxide insulation layer prevents the occurrence of a majority of the parasitic effects that are present in bulk MOSFETs.

The buried insulating silicon dioxide layer provides many advantages for SOI MOSFETs over bulk MOSFETs, such as, for example: lower junction capacitance resulting in improved device speed, isolation of neighboring devices preventing transistor "cross talk," smaller junction area resulting in a lower leakage current, and better short-channel effects. As a result of the improved functionality of SOI MOSFETs, these transistors are more regularly used for system-on-chip (hereinafter "SoC") applications that require the integration of analog, digital, mixed-signal, and/or RF circuits on one chip.

However, the performance of SOI MOSFETs is considerably different relative to bulk MOSFETs due to the existence of the insulating silicon dioxide layer underneath the top silicon, or device layer. In particular, the presence of the insulating silicon dioxide layer causes self-heating due to the significantly lower, about 100 times lower, thermal conductivity of silicon dioxide ($\kappa$=1.4 W/K-m) relative to that of bulk silicon at room temperature ($\kappa$=140 W/K-m). The self-heating of the insulating silicon dioxide layer can cause several adverse effects in SOI MOSFETs, such as, for example, degraded drive current due to the mobility reduction, and decreased transconductance and speed of the transistor. The self-heating effects become more significant as the density of the transistors fabricated on a single silicon chip is increased.

Silicon-on-diamond (hereinafter "SOD") transistors can be used as an alternative to SOI transistors due to their improved self-heating characteristics. The inherent electrical insulating properties of diamond in combination with its relatively high thermal conductivity ($\kappa$=2000 W/K-m) make it a superb substitute for the insulating silicon dioxide. Due to the high thermal conductivity of diamond, the heat generated in the active silicon region of a SOD MOSFET spreads away from the junction and into the underlying substrate, die package, and heat sink. As such, SOD MOSFETs can operate at much higher power levels relative to SOI MOSFETs at the same junction temperature. Various measurements have shown that SOD MOSFETs can sustain a power density greater than ten times that of SOI MOSFETs.

However, fully-depleted SOD MOSFETs suffer from an increase in short-channel effects relative to SOI MOSFETs. One parameter used to determine short-channel effects is the drain induced barrier lowering (hereinafter "DIBL") effect of transistors. DIBL is defined as the threshold voltage variation between low and high drain voltages.

Because insulating diamond or diamond-like carbon film has a larger dielectric permittivity than silicon dioxide, the drain fringing field penetration inside insulating diamond film is larger than that of silicon dioxide. As a result, DIBL increases in fully-depleted SOD MOSFETs in comparison with fully-depleted SOI MOSFETs. For example, a 22 nm Ultra Thin Body (hereinafter "UTB") SOD MOSFET can have a 22% deterioration of DIBL in comparison with a UTB SOI MOSFET.

Thinning the insulation layer of fully-depleted SOD MOSFETs can improve DIBL. For example, using this method, the DIBL value of a 20 nm UTB SOD MOSFET and a 20 nm UTB SOI MOSFET would be similar if the silicon dioxide insulation layer thickness is reduced to 30 nm. However, a trade-off exists between DIBL and parasitic source-substrate ($C_{S-Sub}$) and drain-substrate ($C_{D-Sub}$) capacitances. In particular, as the silicon dioxide insulation layer thickness is reduced, the $C_{S-Sub}$ and $C_{D-Sub}$ increase, which adversely affects transistor performance and working frequency.

Therefore, there is a need to improve the short-channel effects of transistors without the disadvantages identified above. In particular, there is a need to provide fully-depleted SOD MOSFETs with improved DIBL characteristics while maintaining low parasitic $C_{S-Sub}$ and $C_{D-Sub}$ capacitances. Yet further still, there is a need for a method of manufacturing fully-depleted UTB SOD MOSFETs with improved DIBL characteristics.

SUMMARY

A silicon-on-diamond (SOD) transistor includes a silicon-based substrate, a diamond insulating layer over the silicon-based substrate, a silicon-based insulating layer directly over and in contact with the diamond insulating layer, a body over the silicon-based insulating layer, and a gate over the body.

In some embodiments, the silicon-on-diamond transistor can also include a source that directly contacts the diamond insulating layer and the silicon-based insulating layer on a first side of the silicon-on-diamond transistor, and a drain that directly contacts the diamond insulating layer and the silicon-based insulating layer on a second side of the silicon-on-diamond transistor that is opposite the first side. The silicon-on-diamond transistor can also include two trench isolation regions located at opposite ends of the silicon-on-diamond transistor. The silicon-based insulating layer can be in direct contact with the diamond insulating layer, the body, a source, and a drain.

The diamond insulating layer can be made up of, for example, a randomly-oriented polycrystalline diamond, a highly oriented diamond, or a diamond-like carbon. The silicon-based insulating layer can be made up of, for example, silicon dioxide and/or a material having a dielectric permittivity lower than that of the insulating diamond layer. The diamond insulating layer and silicon-based insulating layer can each prevent particles, electrical current, electrons, and/or holes from passing through it.

In some embodiments, the diamond insulating layer can cover an entirety of the silicon-based substrate and, in other embodiments, the silicon-based insulating layer can only partially cover the diamond insulating layer.

The silicon-based insulating layer can have a thickness ranging from, for example, 10 nm to 100 nm. The silicon-based insulating layer can have a length greater than or equal to, for example, 37 nm.

In some embodiments, the body can comprise a channel. The body can have a thickness ranging from, for example, 3.5 nm to 60 nm. The length of the body can be less than the length of the silicon-based insulating layer. In some embodiments, the gate can include a gate insulator and a gate electrode over the gate insulator.

In some embodiments, the silicon-on-diamond transistor can be fully-depleted. The silicon-on-diamond transistor can have a device temperature of less than or equal to, for example, 340 K and a drain induced barrier lowering value of less than or equal to, for example, 80 mV/V.

Details of one or more embodiments and/or implementations of the silicon-on-diamond transistor are set forth in the accompanying drawings and the description below. Other aspects that can be implemented will be apparent from the description and drawings, and from the claims.

DESCRIPTION OF DRAWINGS

Like reference symbols indicate like elements throughout the specification and drawings.

DETAILED DESCRIPTION

A silicon-on-diamond (SOD) transistor includes a silicon-based substrate, a diamond insulating layer over the silicon-based substrate, a silicon-based insulating layer directly over and in contact with the diamond insulating layer, a body over the silicon-based insulating layer, and a gate over the body. The structure of the SOD transistor provides improved drain induced barrier lowering (DIBL) in fully-depleted SOD transistors by using a second, silicon-based insulating layer.

Due to its structure, the SOD transistor reduces the electric field coupling and electric field penetration from the drain and source of the transistor to the body and/or channel of the transistor. The SOD transistor also has improved short channel effects.

Figure 1:
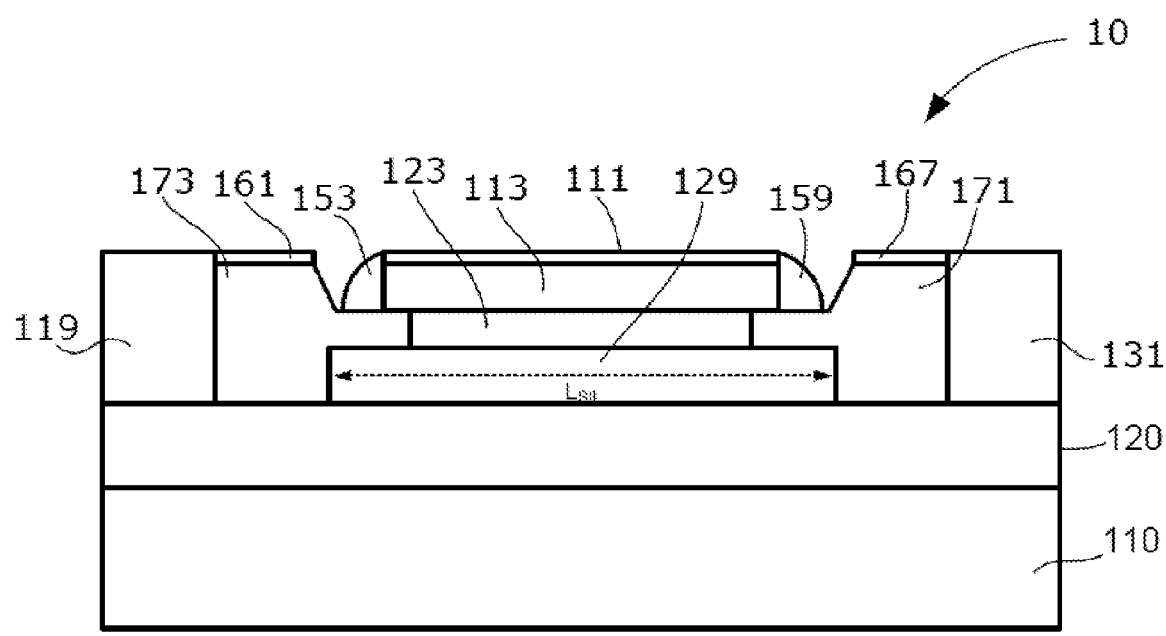
FIG. 1 is a cross-sectional view of a silicon-on-diamond (SOD) transistor having a double insulating layer.

Referring to FIG. 1, a SOD transistor 10 with improved drain induced barrier lowering (DIBL) and short-channel effects is illustrated. The SOD transistor 10 can be, for example, fully-depleted. The SOD transistor 10 includes a silicon substrate 110 that can be, for example, a wafer. The silicon substrate 110 can be made of, for example, acceptor-doped silicon having a thickness of, for example, about 200 μm to 700 μm. An insulating diamond film 120 having a thickness of, for example, about 100 nm to 700 μm is partially or completely overlaid on the silicon substrate 110. The insulating diamond film 120 can be, for example, separate from or part of, i.e., integral to, the silicon substrate 110.

The insulating diamond film 120 can be made up of, for example, a randomly-oriented polycrystalline diamond, a highly oriented diamond, and/or a diamond-like carbon. In the combination of the silicon substrate 110 and the insulating diamond film 120, the insulating diamond film 120 serves as an insulator with excellent thermal conductivity and wide bandgap characteristics.

A second insulation layer 129 is fabricated over the insulating diamond film 120. The second insulation layer 129 is not overlaid over the entire insulating diamond film 120, but preferably covers only a part of the, i.e., less than the entire, insulating diamond film 120. The second insulation layer 129 can be made of, for example, silicon dioxide ($SiO_2$, $\in_r$=3.9), aluminum nitride (AlN, $\in_r$=9), and/or another material having a dielectric permittivity lower than that of the insulating diamond film 120 ($\in_r$=5.5 to 10) in order to reduce the fringing electric field penetration from the drain 171 and source 173. The second insulation layer 129 is located between the insulating diamond film 120 at the bottom, the body, i.e., channel, 123 at the top, the source 173 at the left, and the drain 171 at the right.

Because the SOD transistor 10 is a symmetric device, in some embodiments, the source 173 and the drain 171 can be located at opposite sides of the SOD transistor 10 from that illustrated in FIG. 1. For example, in some embodiments, the source 173 can be located at the right of the second insulation layer 129 and the drain 171 can be located at the left of the second insulation layer 129.

Both the insulating diamond film 120 and the second insulation layer 129 are insulating and can prevent particles, such as, for example, electrical current, electrons, and/or holes from passing and/or tunneling through them.

The thickness of the second insulation layer 129 can vary from, for example, about 10 nm to about 100 nm. The thicker the second insulation layer 129, the lower the fringing field penetration from the drain 171 and source 173 to the body region 123 through the insulating diamond film 120. The thickness of the second insulation layer 129 can also influence the parasitic capacitances of the drain 171 and source 173 to neighboring devices through the trench isolation regions 119, 131.

In an embodiment where the SOD transistor 10 is fully-depleted, the body 123 is totally depleted of mobile charge carriers when the gate electrode 111 voltage reaches the threshold voltage. The gate electric field diffuses mobile charge carriers away in the body region 123 through the gate insulator 113 and leaves behind ionized donor or acceptor impurities. Thus, in a fully-depleted SOD transistor 10, the depletion layer boundary extends to the second insulation layer 129.

The SOD transistor 10 can be, for example, an n-channel MOSFET (hereinafter "n-MOSFET") or a p-channel MOS- FET (hereinafter "p-MOSFET"). In some embodiments, the SOD transistor 10 can be an UTB MOSFET.

In some embodiments, the thickness of the body region 123 in a fully-depleted SOD transistor 10 can vary from, for example, about 15 nm to about 60 nm. In some embodiments, the thickness of the body region 123 in a fully-depleted UTB SOD transistor 10 can preferably vary from, for example, about 3.5 nm to about 15 nm. The body region 123 can be doped, lightly doped, and/or un-doped.

The gate spacers 153, 159 are formed on either side of the gate structure 111, 113 and can be used, for example, as an implant mask in a self-aligned drain 171 and source 173 implantation processes. Additionally, the gate spacer 153 can be used to isolate the source electrode 161 from the gate electrode 111 and the gate spacer 159 can be used to isolate the drain electrode 167 from the gate electrode 111. In some embodiments, a raised drain 171 and source 173 transistor structure can be used to reduce the drain and source spreading resistances.

In some embodiments, the insulating diamond film 120 can be replaced with another insulating material having a dielectric permittivity greater than that of the second insulation layer 129. For example, the material of the insulating diamond film 120 can be replaced with sapphire, aluminum oxide ($Al_2O_3$, $\in_r$=12), aluminum nitride (AlN, $\in_r$=9), and/or silicon carbide (SiC, $\in_r$=13).

The SOD transistor 10 can have, for example, about the same power density level as a conventional SOD MOSFET since the heat generated in the body region 123 travels through the drain 171 and source 173 regions which are overlaid on the insulating diamond film 120. Thus, the active device heat escapes through the insulating diamond film 120 to the silicon substrate 110, to a package (not illustrated), and finally to a heat sink (not illustrated). For example, a 22 nm UTB SOD MOSFET having the structure of the SOD transistor 10 can have a junction temperature less than 3% higher than a conventional SOD MOSFET.

Figure 2:
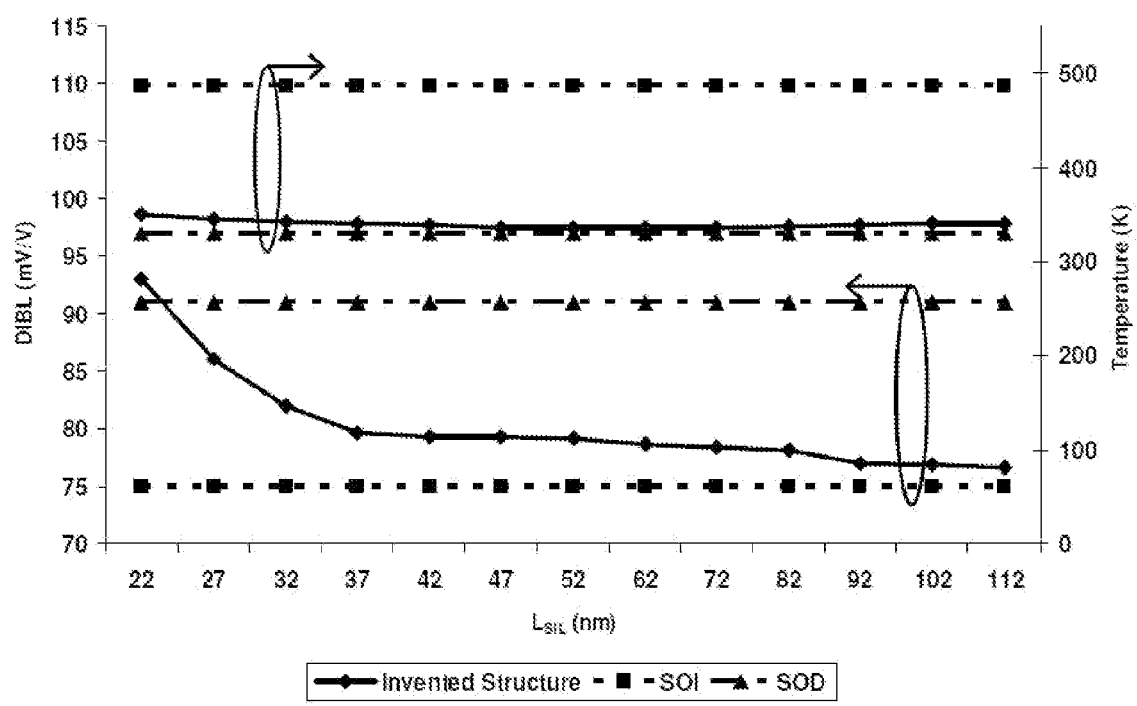
FIG. 2 is a diagram showing the drain induced barrier lowering (DIBL) and the device temperature versus insulating layer length in various types of transistors, including the SOD transistor having a double insulating layer.

FIG. 2 illustrates the drain induced barrier lowering (DIBL) and device temperature of various transistors relative to the second insulation layer 129 length, $L_{SIL}$, which is illustrated in FIG. 1. The three transistors analyzed in FIG. 2 are 22 nm channel length n-MOSFETs having a conventional SOI structure, a conventional SOD structure, and the structure of the SOD transistor 10 illustrated in FIG. 1. The material of the second insulation layer 129 is silicon dioxide and the DIBL was defined as the threshold voltage variation as the drain voltage is varied between 50 mV to 0.8 V.

As illustrated in FIG. 2, DIBL values for the structure of the SOD transistor 10 start to decrease from values close to those of conventional SOD transistors, i.e., approximately 90 to 95 mV/V, to values close to those of conventional SOI transistors, i.e., approximately 75 to 80 mV/V, as $L_{SIL}$ increases from 22 nm to 112 nm. Therefore, electric filed coupling of the drain 171 and source 173 to the body region 123 is reduced. Thereby, DIBL in the structure of the SOD transistor 10 can be improved and short-channel effects can be controlled by the proper choice of $L_{SIL}$.

The variations of the device temperatures versus $L_{SIL}$ are also illustrated in FIG. 2. As shown, the device temperature of the structure of the SOD transistor 10 remains almost constant as $L_{SIL}$ increases. The device temperature of the structure of the SOD transistor 10, which is less than or equal to 340 K, is significantly below the device temperature of conventional SOI transistors, and slightly above the device temperature of conventional SOD transistors. Therefore, SOD power density levels are substantially unchanged by the presence of the second insulation layer 129.

Referring to FIGS. 3 to 8, method of manufacturing a fully-depleted UTB SOD transistor that includes a silicon-based second insulation layer 129 is illustrated.

Figure 3:
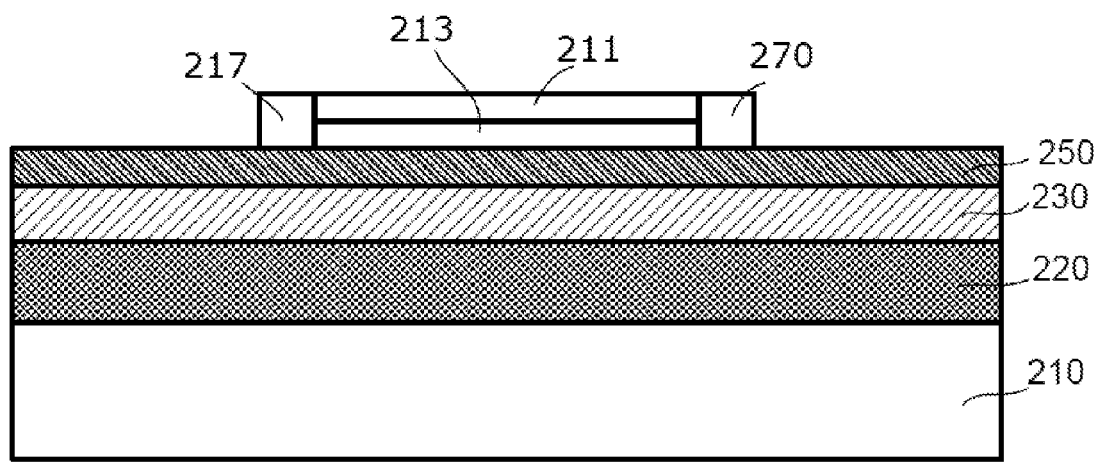
FIG. 3 is a cross-sectional view of a SOD transistor having a double insulating layer, showing the step of silicon nitride spacer fabrication following fabrication of a gate structure.
Figure 4:
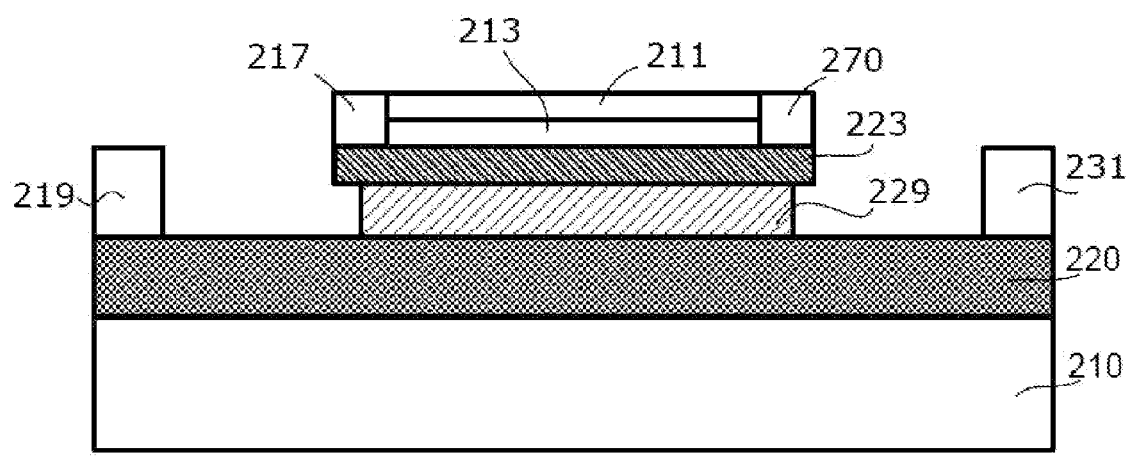
FIG. 4 is a cross-sectional view of a SOD transistor having a double insulating layer, showing the step of shaping of the second insulation layer.

Referring to FIG. 3, initially, a silicon-on-diamond wafer including a silicon substrate 210 and an insulating diamond layer 220 is fabricated. The silicon-on-diamond wafer can be fabricated by, for example, the chemical vapor deposition of diamond and the wafer bonding or epitaxial lateral overgrowth of silicon. Next, the second insulation layer 230, which can be silicon-based, and the conductive channel region 250 can be fabricated by, for example, separation by implantation of oxygen followed by grinding, thinning, and/or polishing the silicon film to a desired thickness. After depositing the gate structures, the gate insulator 211 and gate electrode 213, the silicon nitride spacers 217, 270 can be fabricated.

Next, the second insulation layer 229 and the conductive channel 223 can be fabricated by, for example, wet etching in a self aligned process. The trench isolation regions 219, 231 can be fabricated by, for example, wet etching the remaining second insulation region 230, resulting in the structure illustrated in FIG. 4.

Figure 5:
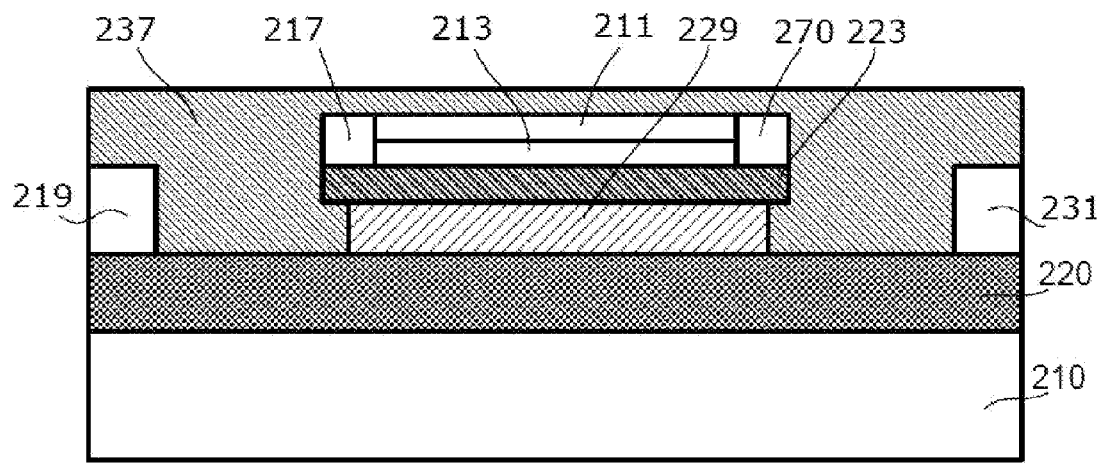
FIG. 5 is a cross-sectional view of a SOD transistor having a double insulating layer, showing the step of fabrication of the source and drain.
Figure 6:
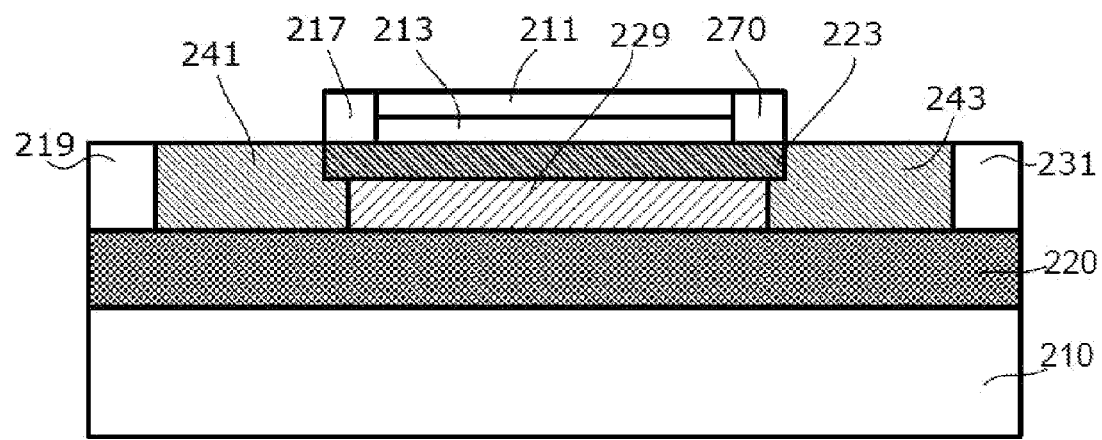
FIG. 6 is a cross-sectional view of a SOD transistor having a double insulating layer, showing the step of leveling the source and drain.
Figure 7:
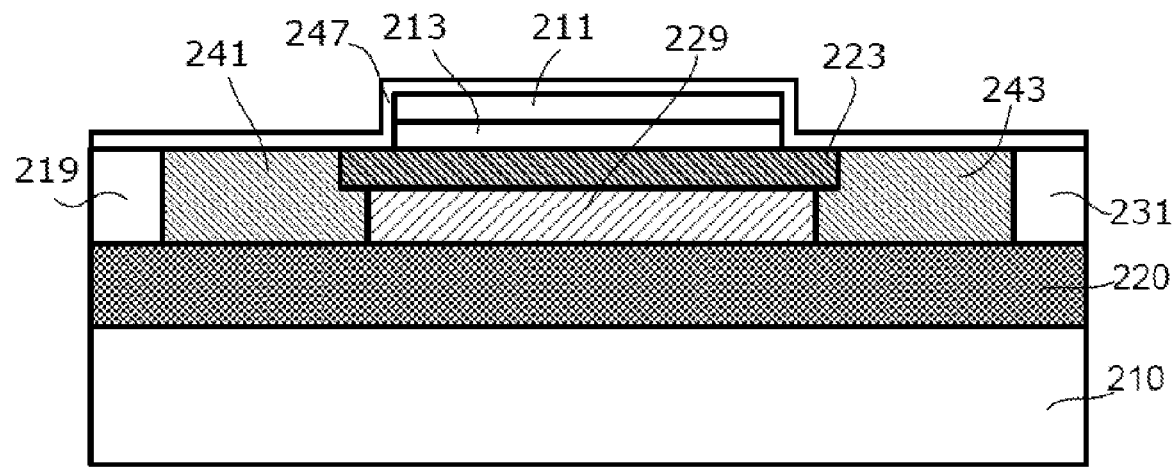
FIG. 7 is a cross-sectional view of a SOD transistor having a double insulating layer, showing the step of shaping of silicon nitride spacers.
Figure 8:
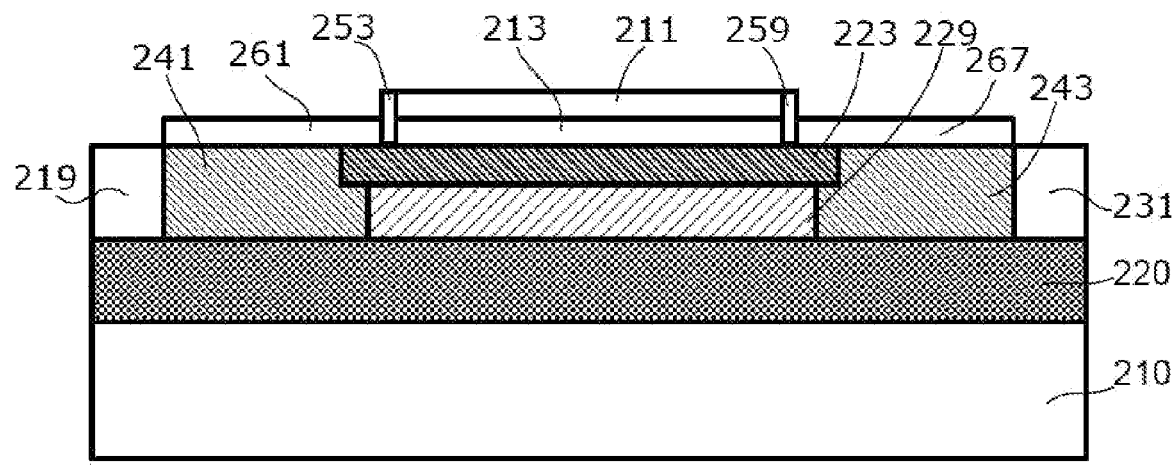
FIG. 8 is a cross-sectional view of a SOD transistor having a double insulating layer, showing the step of formation of oxide spacers.

The patterned structure is covered and filled by silicon 237 to form source and drain regions, as illustrated in FIG. 5. The silicon can be etched to level the source 241 and drain 243 regions to be even with the channel region 223, as illustrated in FIG. 6. The silicon nitride spacers 217, 270 are then removed and the resultant structure is oxidized to form an oxide layer 247, as illustrated in FIG. 7. The oxide 247 is then etched away to form oxide spacers 253, 259. Source electrode 261, drain electrode 267, and gate electrode 211 are finally formed, resulting in the structure illustrated in FIG. 8.

It is to be understood the implementations are not limited to the particular devices or apparatus described which may, of course, vary. It is also to be understood that the terminology used herein is for the purpose of describing particular implementations only, and is not intended to be limiting. As used in this specification, the singular forms "a", "an" and "the" include plural referents unless the content clearly indicates otherwise.

Accordingly, other implementations are within the scope of this application.

What is claimed is:
1. A silicon-on-diamond transistor, comprising:
a silicon-based substrate;
a diamond insulating layer over the silicon-based substrate;
a silicon-based insulating layer directly over and in contact with the diamond insulating layer, the silicon-based insulating layer only partially covering the diamond insulating layer and overlapping with the center of the diamond insulating layer;
a body over the silicon-based insulating layer; and
a gate over the body, wherein:
the silicon-based insulating layer is in direct contact with the diamond insulating layer, the body, a source, and a drain,
the source directly contacts the diamond insulating layer and the silicon-based insulating layer on a first side of the silicon-on-diamond transistor, and
the drain directly contacts the diamond insulating layer and the silicon-based insulating layer on a second side of the silicon-on-diamond transistor that is opposite the first side.

2. The silicon-on-diamond transistor of claim 1, wherein the diamond insulating layer is made up of a randomly-oriented polycrystalline diamond, a highly oriented diamond, or a diamond-like carbon.

3. The silicon-on-diamond transistor of claim 1, wherein the diamond insulating layer directly covers and is in contact with an entirety of the silicon-based substrate.

4. The silicon-on-diamond transistor of claim 1, wherein the silicon-based insulating layer is made up of silicon dioxide.

5. The silicon-on-diamond transistor of claim 1, wherein the silicon-based insulating layer is made up of a material having a dielectric permittivity lower than that of the insulating diamond layer.

6. The silicon-on-diamond transistor of claim 1, wherein the silicon-based insulating layer has a thickness ranging from 10 nm to 100 nm.

7. The silicon-on-diamond transistor of claim 1, wherein the silicon-based insulating layer has a length greater than or equal to 37 nm.

8. The silicon-on-diamond transistor of claim 1, wherein the body has a thickness ranging from 3.5 nm to 60 nm.

9. The silicon-on-diamond transistor of claim 1, wherein the body comprises a channel.

10. The silicon-on-diamond transistor of claim 1, wherein the length of the body is less than the length of the silicon-based insulating layer.

11. The silicon-on-diamond transistor of claim 1, wherein the gate comprises:
   a gate insulator; and
   a gate electrode over the gate insulator.

12. The silicon-on-diamond transistor of claim 1, wherein the silicon-on-diamond transistor is fully-depleted.

13. The silicon-on-diamond transistor of claim 1, wherein the silicon-on-diamond transistor has a device temperature of less than or equal to 340 K.

14. The silicon-on-diamond transistor of claim 1, wherein the silicon-on-diamond transistor has a drain induced barrier lowering value of less than or equal to 80 mV/V.

15. The silicon-on-diamond transistor of claim 1, wherein the diamond insulating layer prevents particles, electrical current, electrons, and/or holes from passing through it.

16. The silicon-on-diamond transistor of claim 15, wherein silicon-based insulating layer prevents particles, electrical current, electrons, and/or holes from passing through it.

17. The silicon-on-diamond transistor of claim 1, further comprising two trench isolation regions located at opposite ends of the silicon-on-diamond transistor.

* * * * *